(12) United States Patent
Seo

(10) Patent No.: US 7,224,012 B2
(45) Date of Patent: May 29, 2007

(54) THIN FILM CAPACITOR AND FABRICATION METHOD THEREOF

(75) Inventor: Young Hun Seo, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 217 days.

(21) Appl. No.: 10/747,111

(22) Filed: Dec. 30, 2003

(65) Prior Publication Data

US 2004/0152344 A1 Aug. 5, 2004

(30) Foreign Application Priority Data

Jan. 30, 2003 (KR) .................. 10-2003-0006345

(51) Int. Cl.
| | |
|---|---|
| H01L 21/8234 | (2006.01) |
| H01L 21/8242 | (2006.01) |
| H01L 21/8244 | (2006.01) |
| H01L 27/108 | (2006.01) |
| H01L 29/76 | (2006.01) |
| H01L 29/94 | (2006.01) |
| H01L 31/119 | (2006.01) |

(52) U.S. Cl. .................. 257/296; 438/238; 438/243; 438/386; 257/300; 257/E27.044; 257/E27.016; 257/E27.033; 257/E21.008; 257/E21.011

(58) Field of Classification Search ............ 438/238, 438/239, 243, 250, 253, 329, 386, 396, FOR. 220, 438/FOR. 430; 257/296, 298, 300, 301, 257/303, 306, E27.017, E27.048, E27.05, 257/E27.093, E21.008, E21.011, E27.016, 257/E27.033

See application file for complete search history.

(56) References Cited

U.S. PATENT DOCUMENTS

| | | | | |
|---|---|---|---|---|
| 6,180,976 | B1 * | 1/2001 | Roy | 257/306 |
| 6,284,619 | B1 | 9/2001 | Seymour et al. | |
| 6,313,003 | B1 | 11/2001 | Chen | |
| 6,387,775 | B1 | 5/2002 | Jang et al. | |
| 6,426,250 | B1 | 7/2002 | Lee et al. | |
| 6,486,529 | B2 | 11/2002 | Chi et al. | |
| 6,569,746 | B2 * | 5/2003 | Lee et al. | 438/398 |
| 6,750,114 | B2 * | 6/2004 | Adler et al. | 439/396 |

FOREIGN PATENT DOCUMENTS

| | | |
|---|---|---|
| KR | 1998-040659 | 8/1998 |
| KR | 1020020073822 | 9/2002 |

* cited by examiner

*Primary Examiner*—Michelle Estrada
*Assistant Examiner*—Quovaunda Jefferson
(74) *Attorney, Agent, or Firm*—Pillsbury Winthrop Shaw Pittman LLP

(57) ABSTRACT

A metal/insulator/metal capacitor and a fabrication method thereof are presented. The method includes forming a first electrode on an insulation film; forming a side wall made of insulating material on a side surface of the first electrode; forming an interlayer insulation film on the top surface of the insulation film including the first electrode and the side wall; forming a via hole to expose the first electrode by selectively etching the interlayer insulation film such that an edge area at which a side surface and a bottom of the via hole intersect is positioned on a top surface of the side wall; forming a dielectric layer on an inner wall of the via hole; forming a second electrode on the dielectric layer such that the via hole is filled; and forming a metal wire on the second electrode such that the metal wire is electrically connected to the second electrode.

6 Claims, 3 Drawing Sheets

THIN FILM CAPACITOR AND FABRICATION METHOD THEREOF

BACKGROUND OF THE INVENTION (a) Field of the Invention

The present invention relates to a fabrication method of a semiconductor device, and more particularly to a method for fabricating a thin film capacitor of a metal/insulator/metal (MIM) structure.

(b) Description of the Related Art

Recently, in a field of analog circuit requiring a high speed operation, semiconductor devices for realizing high capacitance have been developed. In general, since an upper electrode and a lower electrode of a capacitor are made of a conductive polysilicon in a case where the capacitor has a PIP structure where a polysilicon, an insulator, and a polysilicon are stacked in order, a natural oxide film is formed by an oxidation reaction at an interface between the upper and lower electrodes and a dielectric film, which results in reduction of the total capacitance.

To overcome this problem, the structure of capacitor has been changed to a metal/insulator/silicon (MIS) structure or a metal/insulator/metal (MIM) structure. Of these structures, since a capacitor of the MIM structure has a low specific resistance and no inner parasitic capacitance due to depletion, it is mainly used for high performance semiconductor devices.

Conventional techniques for a method for fabricating a thin film capacitor of the MIM structure are disclosed in U.S. Pat. Nos. 6,486,529, 6,426,250, 6,387,775, 6,313,003, and 6,284,619.

Hereinafter, a conventional method for fabricating a thin film capacitor of the MIM structure will be in brief described. FIG. 1 is a sectional view showing a thin film capacitor of a conventional MIM structure.

In order to fabricate the thin film capacitor of the MIM structure shown in FIG. 1, typical processes for fabricating a semiconductor device are first performed on a semiconductor substrate 1, a lower insulation film 2 is formed on the semiconductor substrate 1, and then a lower metal wire 3 is formed on the lower insulation film 2 and is selectively etched leaving a predetermined width.

Here, the lower metal wire 3 corresponds to a first electrode layer in the MIM capacitor.

Subsequently, an interlayer insulation film 4 is thickly deposited on an entire top surface of the lower insulation film 2 including the lower metal wire 3.

Next, a via hole 100 is formed by selectively etching the interlayer insulation film 4 and then an insulation layer 5 is formed on an inner wall of the via hole 100.

Next, metal material 6 such as tungsten is deposited on the insulation layer 5 such that the via hole 100 is completely filled. Here, the metal material 6 corresponds to a second electrode layer in the MIM capacitor.

Finally, by planarizing the metal material 6 through a chemical and mechanical polishing process and forming an upper metal wire 7 thereon, fabrication of the thin film capacitor of the MIM structure is completed.

However, in the conventional method for fabricating the MIM capacitor as described above, there is a problem of over-etch in that, when the interlayer insulation film is plasma-etched for the formation of the via hole, an etching speed is increased at an edge area (indicated by a dotted circle in FIG. 1) in the bottom of the via hole due to a plasma characteristic that charges are crowded at the edge area.

Therefore, there is a fear of leakage of current through the edge area in the over-etched bottom of the via hole, which results in malfunction of devices, even breakage of devices.

SUMMARY OF THE INVENTION

In considerations of the above problems, it is an object of the present invention to prevent a leakage current caused through an edge area in the bottom of a via hole in a MIM capacitor structure.

To achieve the object, according to an aspect of the present invention, a method for fabricating a thin film capacitor comprises the steps of: forming a first electrode layer of a predetermined width on a lower insulation film on a structure of a semiconductor substrate; forming a side wall made of insulating material on a side surface of the first electrode layer; forming an interlayer insulation film on an entire top surface of the lower insulation film including the first electrode layer and the side wall; forming a via hole to expose the first electrode layer by selectively etching the interlayer insulation film such that an edge area at which a side surface and a bottom of the via hole intersect is positioned on a top surface of the side wall; forming a dielectric layer on an inner wall of the via hole; forming a second electrode layer on the dielectric layer such that the via hole is filled; and forming an upper metal wire on the second electrode layer such that the upper metal wire is electrically connected to the second electrode layer.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A thin film capacitor and a fabrication method thereof according to a preferred embodiment of the present invention will now be described in detail with reference to the accompanying drawings.

Figure 1:
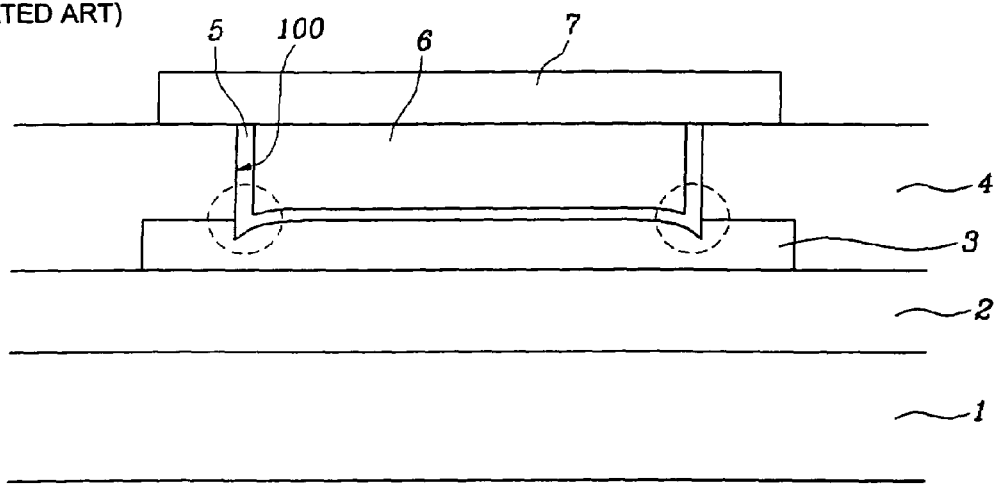
FIG. 1 is a sectional view showing a conventional thin film capacitor.
Figure 2A:
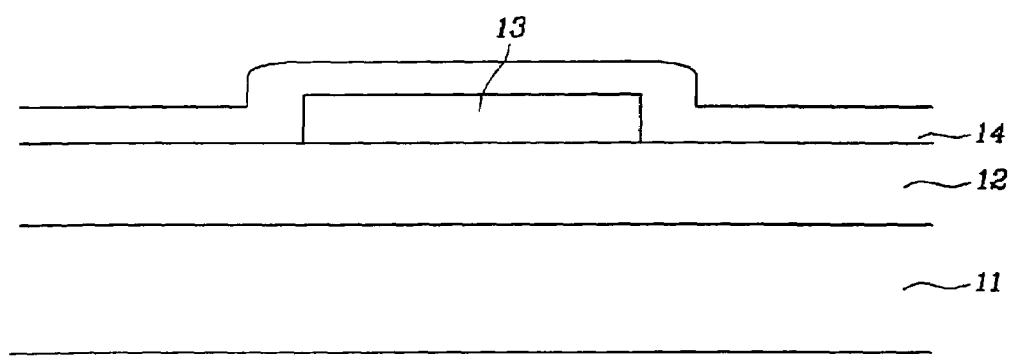
FIGS. 2a to 2e are sectional views showing a method for fabricating a thin film capacitor according to the present invention.
Figure 2B:
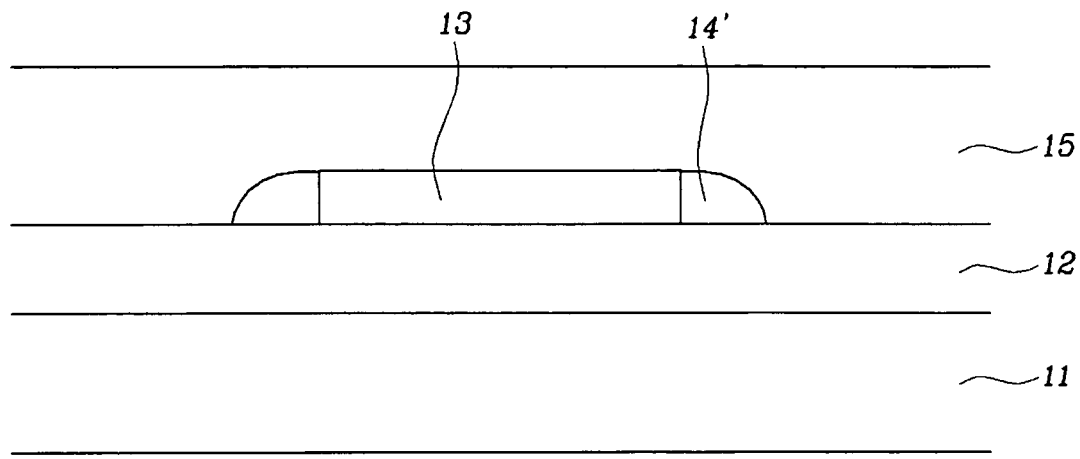
Figure 2C:
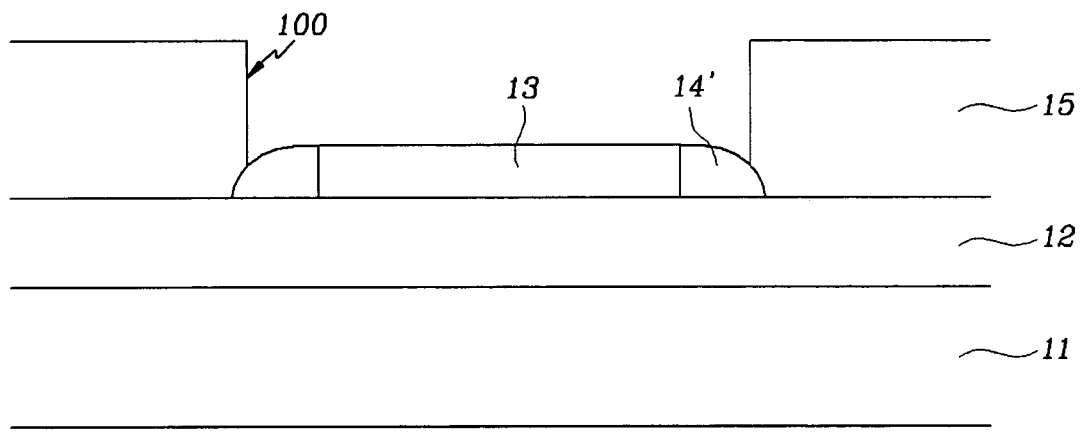
Figure 2D:
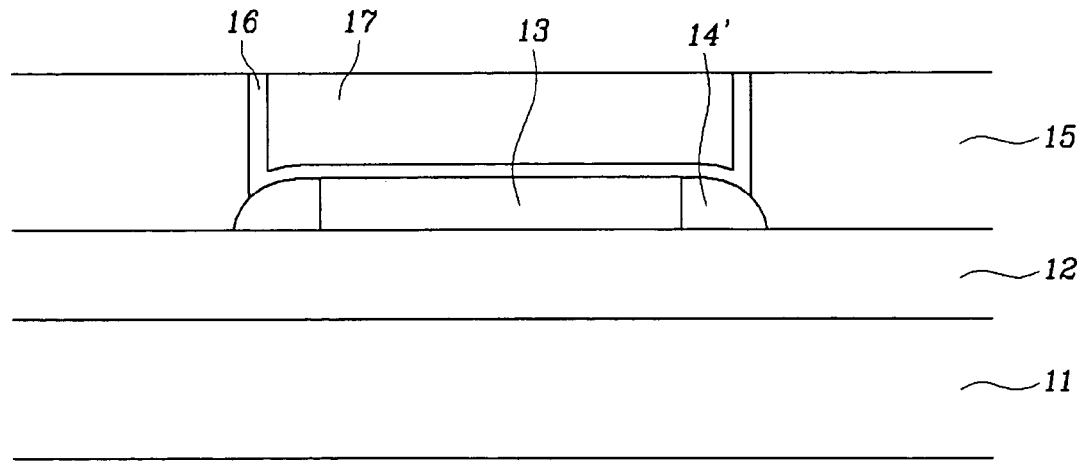
Figure 2E:
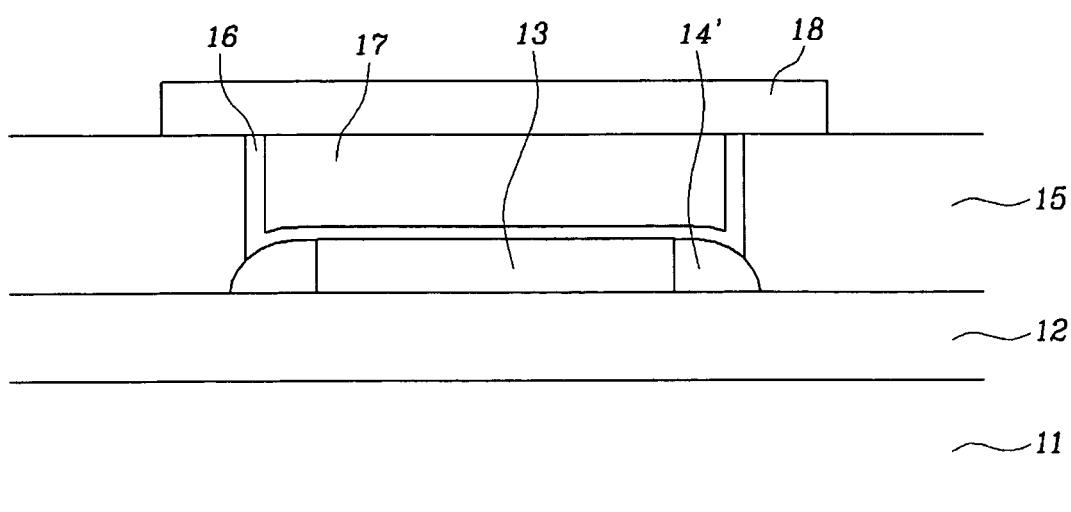

A thin film capacitor fabricated according to an embodiment of the present invention is shown in FIG. 2e, where a lower insulation film 12 and a thin film capacitor are sequentially formed on a structure 11 of a semiconductor substrate in which individual elements are formed.

Specifically, a lower metal wire 13 as a first electrode layer in a MIM capacitor structure is formed on the lower insulation film 12 and a side wall 14' made of insulation material is formed on a side surface of the lower metal wire 13.

Here, the side wall 14' can be composed of a nitride film.

In addition, an interlayer insulation film 15 is formed on an entire top surface of the lower insulation film including the lower metal wire 13 and the side wall 14'. Here, the interlayer insulation film 15 is provided with a via hole 100 to expose the lower metal wire 13.

At this time, an edge area at which a side surface and a bottom of the via hole intersect is positioned on a top surface of the side wall 14'.

A dielectric layer 16 is formed on an inner wall of the via hole 100, and metal material 17 as a second electrode layer in the MIM capacitor structure is formed on the dielectric layer 16 such that the via hole 100 is filled.

Now, a method for fabricating the thin film capacitor of the present invention as described above will be in detail described.

FIGS. 2a to 2e are sectional views showing a method for fabricating the thin film capacitor according to the present invention.

First, as shown in FIG. 2a, typical processes for fabricating a semiconductor device are first performed on a semiconductor substrate in order to form a structure 11 of the semiconductor substrate in which individual elements are formed, and then a lower insulation film 12 composed of an oxide film such as PSG is formed on the structure of the semiconductor substrate.

Subsequently, a metal layer is formed on the lower insulation film 12 and a lower metal wire 13 is formed by selectively etching the metal layer, leaving a predetermined width. Here, the lower metal wire 13 corresponds to a first electrode layer in the MIM capacitor.

Subsequently, a nitride film 14 is deposited on an entire top surface of the lower insulation film 12 including the lower metal wire 13.

Next, as shown in FIG. 2b, a side wall 14' is formed by etching back the nitride film 14, leaving the nitride film only in a side surface of the lower metal wire 13.

Subsequently, an interlayer insulation film 15 is thickly deposited on an entire top surface of the lower insulation film 11 including the lower metal wire 13 and the side wall 14' and then is planarized by a chemical and mechanical polishing process.

Next, as shown in FIG. 2c, a via hole 100 to expose the lower metal wire 13 is formed by selectively etching the interlayer insulation film 15. Here, the side wall 14' formed on the side surface of the lower metal wire 13 functions as an etch stop layer.

When the interlayer insulation film 15 is etched by using a plasma for the formation of the via hole 100, although an etching speed at an edge area of a bottom of the via hole is increased as the plasma is crowded at the edge area, there is no risk of exposure of the lower metal wire 13 since the side wall 14' is positioned at a lower portion of the edge area.

Next, as shown in FIG. 2d, an insulation layer 16 is formed on an inner wall of the via hole 100, metal material 17 such as tungsten is deposited on the insulation layer 16 such that the via hole 100 is completely filled and then is planarized through a chemical and mechanical polishing process. Here, the metal material 17 corresponds to a second electrode layer in the MIM capacitor.

Finally, a metal layer is formed on the planarized metal material and then an upper metal wire 18 is formed by selectively etching the metal layer, leaving a predetermined width such that the metal layer is electrically connected to the metal material 17.

As described above, according to the present invention, since the side wall made of the nitride film is formed on the side surface of the lower metal wire, although the edge area of the bottom of the via hole is over etched when the via hole is formed by selectively etching the interlayer insulation film, the lower metal wire will not be exposed because of the side wall positioned at the lower portion of the edge area, which results in prevention of leakage of current.

Accordingly, due to the prevention of leakage of current, performance of semiconductor devices can be improved and reliability of the devices can be increased.

Although a preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film capacitor comprising:
   a first electrode layer of a predetermined width, formed on a lower insulation film on a structure of a semiconductor substrate;
   a side wall made of insulating material, formed on a side surface of the first electrode layer;
   an interlayer insulation film having a via hole to expose a whole top surface of the first electrode layer and a portion of the side wall, formed on an entire top surface of the lower insulation film including the first electrode layer and the side wall;
   a dielectric layer formed on an inner wall of the via hole;
   a second electrode layer formed on the dielectric layer such that the via hole is filled; and
   an upper metal wire formed on the second electrode layer such that the upper metal wire is electrically connected to the second electrode layer,
   wherein an edge area at which a side surface and a bottom of the via hole intersect is located on a top surface of the side wall.

2. The thin film capacitor of claim 1, wherein the side wall is composed of a nitride film.

3. The thin film capacitor of claim 2, wherein the second electrode layer is made of tungsten.

4. A method for fabricating a thin film capacitor, comprising:
   forming a first electrode layer of a predetermined width on a lower insulation film on a structure of a semiconductor substrate;
   forming a side wall made of insulating material on a side surface of the first electrode layer;
   forming an interlayer insulation film on an entire top surface of the lower insulation film including the first electrode layer and the side wall;
   forming a via hole to expose a whole top surface of the first electrode layer and a portion of the side wall by selectively etching the interlayer insulation film such that an edge area at which a side surface and a bottom of the via hole intersect is positioned on a top surface of the side wall;
   forming a dielectric layer on an inner wall of the via hole;
   forming a second electrode layer on the dielectric layer such that the via hole is filled; and
   forming an upper metal wire on the second electrode layer such that the upper metal wire is electrically connected to the second electrode layer.

5. The method of claim 4, wherein the forming of the side wall includes depositing a nitride film on an entire top surface of the lower insulation film including the first electrode layer, and etching back the nitride film so as to leave the nitride film only in a side surface of the first electrode layer.

6. The method of claim 5, wherein the forming of the second electrode layer includes depositing tungsten on the dielectric layer such that the via hole is filled.

* * * * *